United States Patent [19]
Rabaey et al.

[11] Patent Number: 4,610,018
[45] Date of Patent: Sep. 2, 1986

[54] PULSE CODE MODULATION TRANSLATORS

[75] Inventors: Dirk H. L. C. Rabaey, Borgerhout; Didier R. Haspeslagh, Harelbeke, both of Belgium

[73] Assignee: International Standard Electric Corporation, New York, N.Y.

[21] Appl. No.: 650,336

[22] Filed: Sep. 13, 1984

[30] Foreign Application Priority Data

Sep. 19, 1983 [BE] Belgium ............................ 2/60209

[51] Int. Cl.⁴ ............................................ H03M 7/30
[52] U.S. Cl. ........................................ 375/25; 375/30; 375/122; 332/11 D
[58] Field of Search ...................... 375/25, 30, 31, 32, 375/122; 332/11 D; 358/135, 260

[56] References Cited

U.S. PATENT DOCUMENTS

| | | | |
|---|---|---|---|
| 3,705,359 | 12/1972 | Kappes | 375/30 |
| 3,937,897 | 2/1976 | Song | 332/11 D |
| 4,311,988 | 1/1982 | Kelley et al. | 375/30 |
| 4,370,632 | 1/1983 | Allgood et al. | 375/30 |

OTHER PUBLICATIONS

Owen, *PCM and Digital Transmission Systems*, McGraw-Hill, 1982, pp. 61-68.

*Primary Examiner*—Marc E. Bookbinder
*Assistant Examiner*—Raymond C. Glenny
*Attorney, Agent, or Firm*—John T. O'Halloran; Jeffrey P. Morris

[57] ABSTRACT

Pulse Code Modulation (PCM) translator for translating a PCM input word into a PCM output word, one of said words being in accordance with a compressed code and the other with a linear code, characterized in that it is adapted to convert the binary bits of the input word into those of the output word in accordance with either the A-law or the mu-law. The circuit forms part of a telephone line circuit (LC) connected between a telephone line (LI) and a digital switching network (SNW) and comprising the cascade connection of a subscriber line interface (SLIC) able to perform line control and supervision, a digital signal processor (DSP) mainly adapted to execute analog-to-digital and digital-to-analog conversion operations, the above transcoder circuit and a dual processor terminal controller (DPTC) which deals with the general control of the line circuit. The DSP only processes linear PCM signals, whereas the DPTC solely operates on companded PCM signals.

4 Claims, 5 Drawing Figures

PULSE CODE MODULATION TRANSLATORS

BACKGROUND OF THE INVENTION

The present invention relates to a Pulse Code Modulation (PCM) translator for translating a PCM input word into a PCM output word, one of said words being in accordance with a compressed code and the other with a linear code.

An object of the present invention is to provide a translator of this type which is adapted to selectively perform the translation according to the A-law or to the mu-law and nevertheless is of a relatively simple structure.

According to the invention this object is achieved due to the fact that it is adapted to convert the binary bits of the input word into those of the output word in accordance with either the A-law or the mu-law as given by the selectable binary value of a control bit which determines the digital values of several parameters of the translator.

By the use of the selectable control bit value the translator is able to selectively perform a translation according to the A-law or to the mu-law and because this bit controls several parameters of the translator the latter may be given a simple structure which is substantially the same for both laws.

Another characteristic feature of the present translator is that it it able to translate a compressed PCM input word including a 3-bit segment code and a 4-bit step code into a linear PCM output word by determining the function $$J=(L+a\cdot 2^4+b\cdot 2^{-1})\cdot 2^{K'}+c$$

wherein
J is said output word;
L is said step code;
a, b and c are variables;
K' is related to said segment code and is dependent, together with said variables a, b and c, on said control bit (A) indicating that said input word is coded according to the A-law or mu-law.

From this function it follows that the operations to be executed for the A-law and the mu-law are very similar and only differ in details due to which it is possible to use for both laws a same structure for the translator, as already mentioned.

Still another characteristic feature of the last mentioned translator is that it includes:
decoder means for decoding said 3-bit segment code into a 1-out-of-8 code S7, S6, ..., S'1, S'∅;
logic means coupled to said decoder means and controlled by said control bit and providing the variables:

$$a=\overline{S'\emptyset}+A$$

$$b=\overline{S'\emptyset}(\overline{S'1}+A)$$

$$S\emptyset=S'\emptyset\cdot A$$

$$S1=S'\emptyset\cdot\overline{A}+S'1$$

the code word S7, ..., S1, S∅ constituting an altered segment code having a decimal value K';
means for modifying said step code L by said variables a and b so as to obtain an altered step code $$L+a\cdot 2^4+b\cdot 2^{-1}$$

multiplier means coupled to said modifier means for multiplying said altered step code with $2^{K'}$ so as to obtain the product $(L+a\cdot 2^4+b\cdot 2^{-1})\cdot 2^{K'}$ and adder means coupled with said multiplier means and controlled by said control bit to add said variable c to said product so as to obtain said output word J.

The translator is thus able to perform a translation either according to the A-law or to the mu-law under the control of the selectable control bit and by the use of relatively simple logic means.

Yet another characteristic feature of the present translator is that it is adapted to translate a linear PCM input word into a compressed PCM output word including a 3-bit segment code and a 4-bit step code by determining the functions $$K=\text{Log}_2\ [(J+c)\cdot 2^{-4}]$$

$$L=(J+c)\cdot 2^{-K'}-d$$

wherein
J is said input word;
K is said segment code;
L is said step code;
c and d are variables
K' is related to said segment code and is dependent together with c and d on said control bit (A) indicated that said output word is coded according to the A- or mu-law.

From these functions it again follows that the operation to be executed for the A-law and the mu-law are very similar and only differ in details due to which it is possible to use for both laws a same structure for the translator.

Still another characteristic of the last mentioned PCM transcoder is that is includes:
adder means controlled by said control bit to add said variable c to said input J to obtain an altered input word J+c and store it in a shift register;
decoder means coupled with said shift register for decoding the 8 most significant bits of said altered input word J+c into a 1-out-of-8 code S7, S6, ..., S'1, S'∅ but by taking only the activated bit of highest power of said altered input word into account;
encoder means coupled to said decoder means for coding said 1-out-of-8 code into said 3-bit segment code K;
logic means which are coupled to said decoder means and controlled by said control bit and which provide the variables:

$$S\emptyset=S'\emptyset\cdot A$$

$$S1=S'\emptyset\cdot\overline{A}+S'1$$

the code word S7, ..., S1, S∅ having the decimal value K';
multiplier and adding means for multiplying said altered input word J+c by $2^{-K'}$ and adding said variable −d to this product so as to obtain said step code L.

The invention also relates to a shift register cell with a data input coupled to a data output through the cascade connection of an input storage circuit and an output storage circuit. This shift register cell is characterized in that it also has an auxiliary data input, said auxiliary data input and the output of said first storage circuit being coupled to the input of said second storage circuit via respective first and second gating means having a common control input and such that they are always in an opposite state of conductivity.

The invention further also relates to a multiplier device for multiplying a binary word stored in a first shift register with $2^x$, with $x = \emptyset, \ldots K$, by shifting said word through x stages of said shift register.

This multiplier device is characterized in that said second shift register includes K stages, that the output of said first shift register is coupled with the K stages of said second shift register via K respective first gating means which are controlled by respective bits of a binary 1-out-of K code which has said decimal value x, and that to each of said stages is associated a second gating means, the second gating means being controlled by said respective bits all in such a way that when a first gating means establishes a connection between the output of the first shift register and a stage of the second shift register, the latter stage is isolated from the other stages of this shift register by the second gating means associated therewith.

The above mentioned and other objects and features of the invention will become more apparent and the invention itself will be best understood by referring to the following description of an embodiment taken in conjunction with the accompanying drawings in which:

DESCRIPTION OF THE PREFERRED EMBODIMENT

Figure 1:
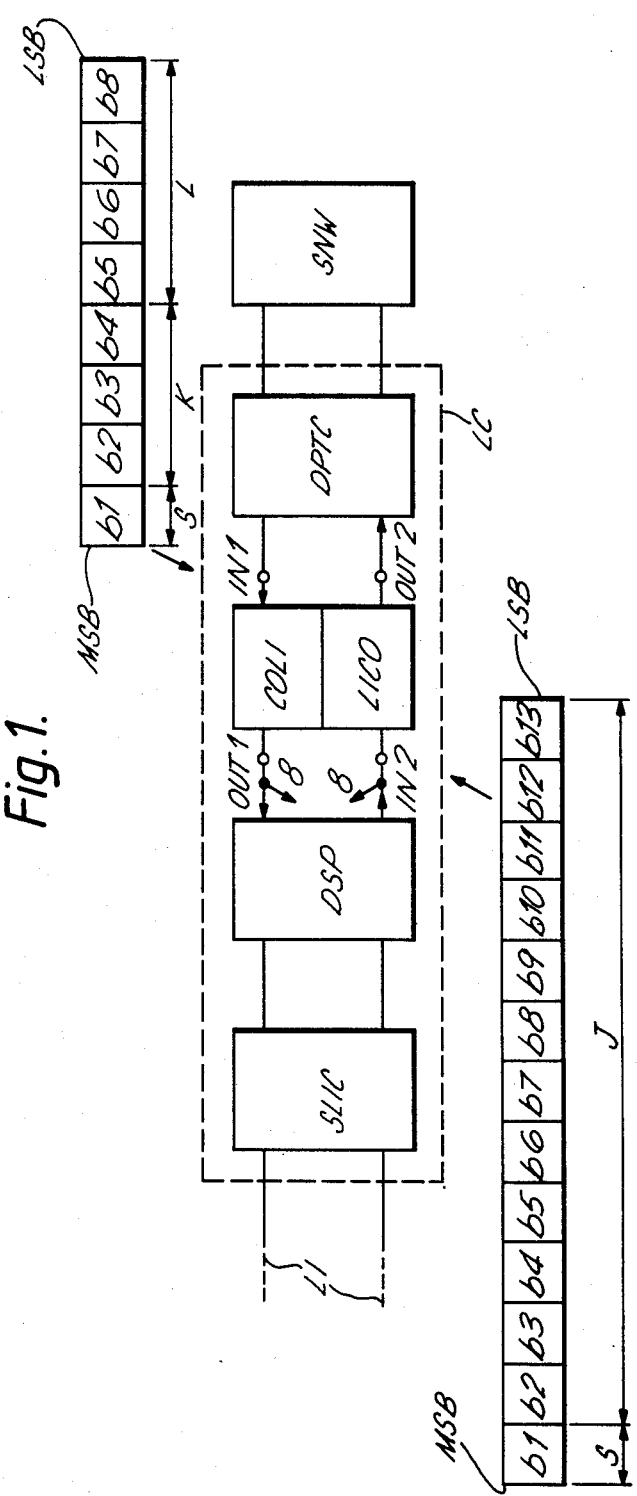
FIG. 1 is a schematic block diagram of a telecommunication line circuit LC including a PCM translator circuit COLI and LICO according to the invention.

As shown in FIG. 1, the translator or transcoder circuit TC forms part of a telephone line circuit LC connected between a telephone line LI and a digital switching network SNW and comprising the cascade connection of a subscriber line interface SLIC able to perform line control and supervision, a digital signal processor DSP mainly adapted to execute analog-to-digital and digital-to-analog conversion operations, the above transcoder circuit TC and a dual processor terminal controller DPTC which deals with the general control of the line circuit. The DSP only processes linear PCM signals, whereas the DPTC solely operates on companded PCM signals. The purpose of the transcoder circuit TC and more particularly of its COLI circuit is therefore to transcode companded PCM signals received from DPTC on its input terminal IN1 into linear PCM signals which are then transmitted to DSP via output terminal OUT1, and vice-versa in the LICO circuit for the signals received on input terminal IN2 from DSP and transmitted via output terminal OUT2 to DPTC. The TC is provided in common for eight DSP and SLIC circuits as indicated by the multipling arrows but could be used for as much as 32 DPS and SLIC circuit. Indeed, the data received in the TC and transmitted therefrom form part of a 32-channel frame of which only 8 are effectively used and wherein each channel has a repetition period of 125 microseconds. The data bits exchanged between TC and DPS have a bit rate of 4,096 Kbit/sec and, each used channel contains a 16-bit PCM signal of which 13 bits b1 to b13 together constitute a linear PCM signal. Bit b1 is the sign bit S and bits b2 to b13 define the absolute magnitude J of the signal. Bit b1 is preceded by two identical bits and bit b13 is followed by a bit which may be used as a rounding bit. This 16-bit pattern is for instance received under a form wherein all bits are inverted and the 2's complement has been taken. The data exchanged between TC and DPTC have a bit rate of 2,048 Kbit/sec and each used channel contains an 8-bit companded PCM signal comprising bits b1 to b8. This PCM signal is coded according to the segmented logarithmic A-law or mu-law each comprising 8 segments for each of the values of the sign S indicated by bit b1. The 3 bits b2 to b4 define one segment K among 8 possible segments $K\emptyset$ to K7 and the bits b5 to b8 define one step L among 16 possible equal steps within the segment. According to the mu-law the relative values of the step sizes in the segments $K\emptyset$ to K7 are equal to $2^0$ to $2^7$ respectively, whereas in the A law they are 2, 2, $2^2$, ..., $2^7$ respectively. This means that the step size in segment $K\emptyset$ according to the A-law is twice the step size in segment $K\emptyset$ according to the mu-law. The companded PCM signal b1 to b8 is for instance received from and transmitted to DPTC under a form wherein all bits except the sign bit are inverted (mu-law) or wherein only the even numbered bits are inverted (A-law).

Figure 2:
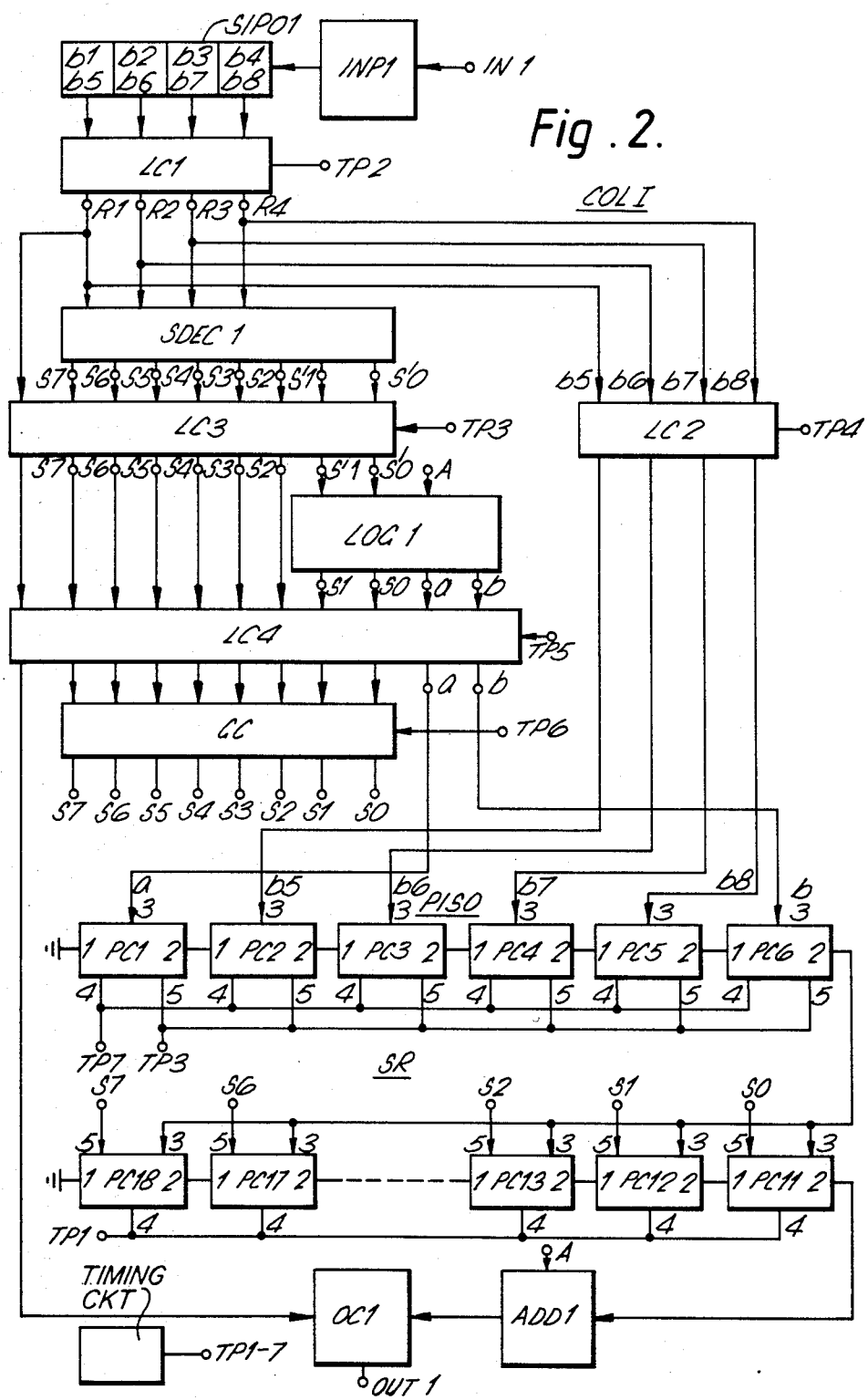
FIGS. 2 and 3 show parts COLI and LICO of this translator circuit in more detail respectively.
Figure 5:
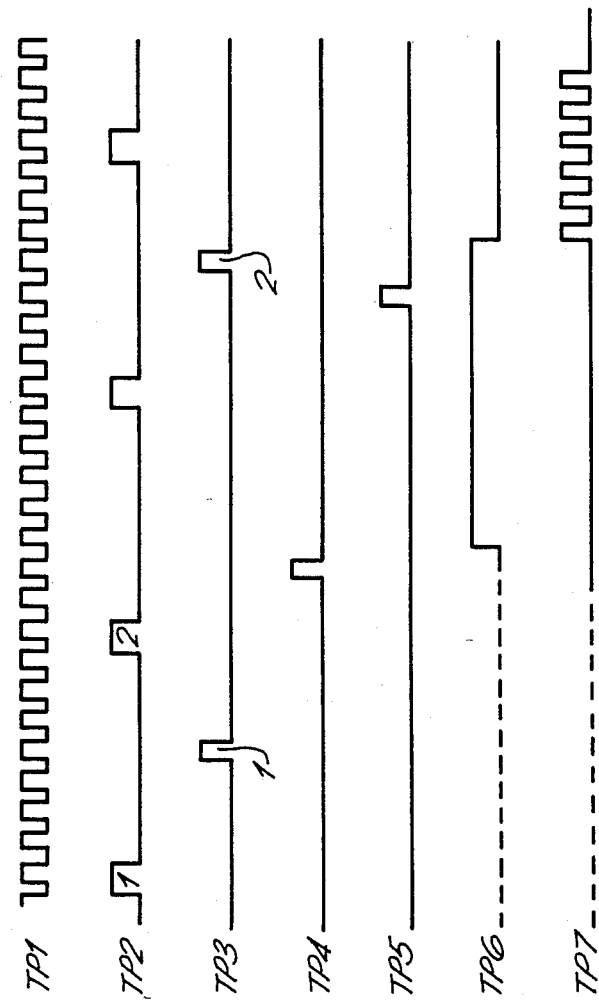
FIG. 5 shows timing pulses for controlling the translator.

Reference is now made to FIG. 5 and to FIG. 2 showing the COLI circuit, of the transcoder TC, which is adapted to transcode an 8-bit companded PCM signal or word into a 13-bit linear PCM signal or word.

The COL1 circuit includes an input circuit INP1, a serial-in-parallel-out register SIPO1, a parallel-in-serial-out register PISO, a shift register SR, a segment decoder circuit SDEC1, an adder circuit ADD1, an output circuit OC1, a logic circuit LOG1, latch circuits LC1 to LC4, a gating circuit GC, and a timing circuit which generates timing pulses of which only TP1 to TP7 required to explain the operation of the COL1 circuit are represented in FIG. 5. The latch circuits LC1, LC2, LC3 and LC4 are controlled by TP2, TP4, TP3 and TP5 respectively, and gating circuit GC is controlled by TP6.

The input IN1 of the COL1 circuit is coupled via the input circuit INP1 to that of SIPO1 whose outputs are coupled to the inputs of LC1 having output R1 to R4. Output R1 is connected to output circuit OC1 via latch circuits LC3 and LC4; outputs R2 to R4 are connected to respective inputs of SDEC1 and R1 to R4 are moreover coupled via LC2 to the data inputs 3 of cells PC2 to PC5 of PISO. The latter comprises the interconnected cells PC1 to PC6 with commoned control inputs 4 controlled by timing pulses TP7 as well as commoned control inputs 5 controlled by timing pulses TP3. The output 2 of each of these cells is connected to the input 1 of the following one, except for the input 1 of PC1 which is grounded and for the output 2 of PC6 which is connected to the commoned data inputs 3 of the cells PC11 to PC18 of SR. The latter cells further have interconnected control inputs 4 controlled by timing pulses TP1, as well as individual control inputs 5. The segment decoder circuit SDEC1 has outputs $S'\emptyset$, $S'1$ and S2 to S7 of which S2 to S7 are coupled via latching circuits LC3 and LC4 and gating circuit GC in cascade to the last mentioned control inputs 5 of the cells PC13 to PC18 of SR. The outputs $S'\emptyset$ and $S'1$ of SDEC1 are coupled via latching circuit LC3 to inputs of the logic circuit LOG1 having a further control input A, and outputs a, b and S1, S∅. The control input A is indicative of A-law or mu-law, A being then 0 and 1 respectively. The outputs a and b are connected via LC4 to the data inputs 3 of the cells PC1 and PC6 of PISO1 respectively, whilst the outputs S∅ and S1 are coupled via LC4 and GC in cascade to the control inputs 5 of the cells PC11 and PC12 of SR respectively. The output 2 of PC11 is coupled to the output circuit OC1 via an adder circuit ADD1 which is also controlled by the above control input A.

Figure 4:
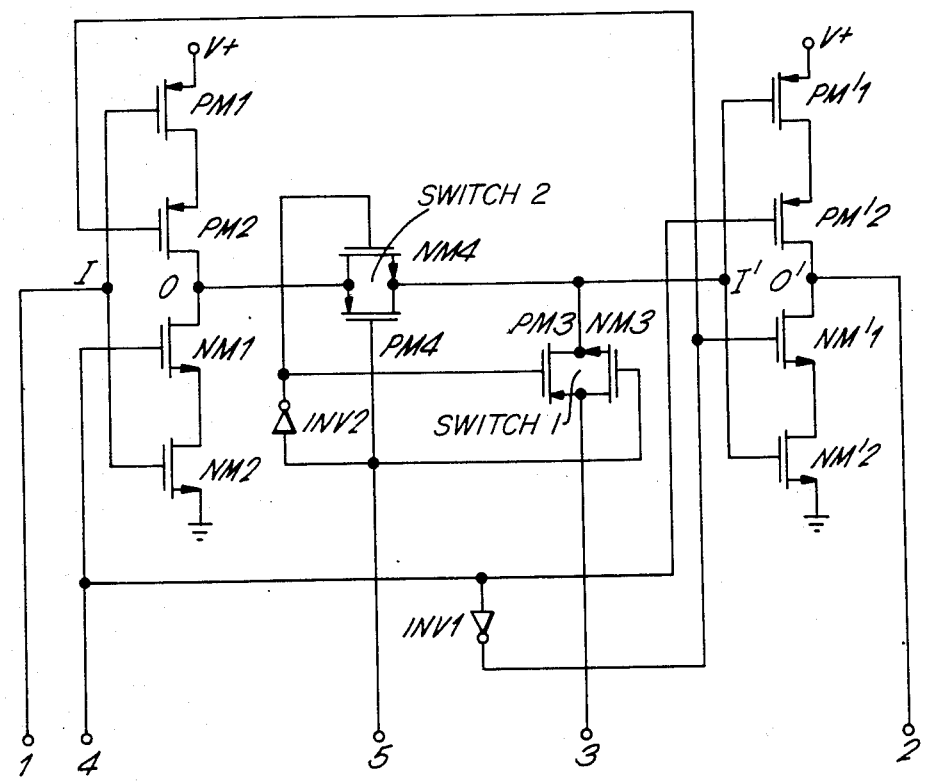
FIG. 4 is a detailed view of a register cell schematically shown in FIGS. 2 and 3.

Each of the cells PC1 to PC6 of PISO is of the type shown in FIG. 4, to be considered with switch S1 only and includes two identical input and output circuits. The cell input circuit comprises PMOS transistors PM1 and PM2 and NMOS transistors NM1 and NM2 whose source-to-drain and drain-to-source paths are connected in series between V+ and ground. The interconnected gates of PM1 and NM2 and the interconnected drains of PM2 and NM1 constitute the input I and output O of the cell input circuit respectively, the gates of NM1 and of PM1 being controlled from the cell control input 4 directly and via inverter INV1 respectively. The constituent components of the output circuit are indicated by the same numeral as in the input circuit, however provided with a prime. The gates of NM'1 and PM'2 are now controlled from the cell control input 4 via the inverter INV1 and directly respectively. The input I' and the output O' are connected to the serial data input 1 and to the serial data output 2 of the cell respectively and a parallel data input 3 is coupled to the commoned output O and input I' of the cell input and output circuits through a switch S1. The latter comprises PMOS transistor PM3 and NMOS transistor NM3 whose source and drain electrodes are connected to the drain and source electrodes of NM3 and PM3 respectively. The gates of NM3 and PM3 are controlled from the control input 5 directly and via an inverter INV2 respectively. It is clear that switch S1 is closed when control input 5 is activated (1).

Each of the cells PC11 to PC18 of SR is again of the type shown in FIG. 4, however to be considered with both switches S1 and S2. Switch S2 is of the same structure as switch S1 but PM4 and NM4 are now controlled from control input 5 directly and via the inverter INV2 respectively, so that switch S2 is closed when control input 5 is deactivated (0).

A cell circuit PC1/6 of PISO operates as follows. To enter and transfer data applied to the serial input 1, the control input 4 is alternately activated and deactivated and the control input 5 is maintained deactivated, whereas to enter and transfer data applied to the other data input 3 the control inputs 5 and 4 should be simultaneously activated and deactivated respectively. In the first case the data applied to serial data input 1 are inverted in the cell input circuit and latched in the cell upon control input 4 being activated and then inverted in the cell output circuit and transferred to the cell output 2 upon control input 4 being deactivated. In the second case data applied to the parallel data input 3 is inverted and transferred to the cell output 2 upon control inputs 5 and 4 being activated and deactivated respectively. Indeed:

when control input 4 of the cell circuit is activated, NM1 and PM2 of the cell input circuit are conductive whereas PM'2 and NM'1 of the cell output circuit are blocked. Thus the drain electrodes of PM1 and PM2 are commoned to output 0 so that the cell input circuit acts and an inverter for data applied to ints input I or 1;

when control input 4 is deactivated the above roles of the input and output circuits are reversed;

when control inputs 5 and 4 are simultaneously activated and deactivated respectively, data applied to input 3 are applied via switch S1 to the cell output circuit and inverted therein and applied to cell output 2.

A cell circuit PC11/18 of SR operates in a similar was as described above for a cell circuit PC1/6, but now the cell input circuit is disconnected from the cell output circuit by switch S2 when time switch S1 is closed and vice-versa since these switches are controlled by opposite control signals.

It may be shown that a suitable algorithm for transcoding a 8-bit companded PCM word comprising bits b1 to b8 with sign bit S=b1, segment code K=b2b3b4 and step code L=b5b6b7b8 into a 13-bit linear PCM word J is given by $$J = 2^{K'}(L + a \cdot 2^4 + b \cdot 2^{-1}) + c$$

or $$J = J' + c$$

wherein:
c=0 for the A-law and c=−16 for the mu-law;
K' is equal to ∅ to 7 for the segments K∅ to K7, except for segment K∅ in the A-law for which this value is 1 instead of ∅;
a=b=1 for the segments K2 to K7 in both the laws and for K1 in the mu-law; so that $$J' = 2^{K'}(L + 2^4 + 2^{-1})$$

a=1 and b=0 for segment K∅ (mu-law) and K1 (A-law) a=1 and b=0 so that $$J' = 2^{K'}(L + 2^4)$$

a=b=0 and K'=1 for segment K∅ (A-law) so that $$J' = 2 \cdot L$$

The COLI circuit described above is able to calculate this algorithm in the way described hereinafter.

A companded PCM signal applied to the input IN1 of the COLI1, with the most significant bit (MSB), first, is possibly transformed in input circuit INP1 and the resulting 8-bit companded PCM signal comprising bits b1 to b8 (FIG. 1) and defining S, K and L mentioned above is serially entered into SIPO1 as two successive sets of four bits b1 to b4 and b5 to b8.

Starting with the four bits b1 to b4, these are latched in the latching circuit LC1 under control of a first timing pulse TP2 (FIG. 5). The sign bit S=b1 is thus fed to the output circuit OC1, whereas the 3-bit segment code K=b2b3b4 is applied to the segment decoder SDEC1 wherein it is decoded into a 1(out-of-8 segment code constituted by the bits

S7 S6 S5 S4 S3 S2 S'1 S'∅ provided at the like named outputs of SEDC1. This code defines the segments K∅ to K7 according to the following table

| S7 | S6 | S5 | S4 | S3 | S2 | S'1 | S'∅ | Decimal value K' |
|---|---|---|---|---|---|---|---|---|
| K∅ ∅ | ∅ | ∅ | ∅ | ∅ | ∅ | ∅ | 1 | ∅ |

|     | S7 | S6 | S5 | S4 | S3 | S2 | S'1 | S'0 | Decimal value K' |
| --- | --- | --- | --- | --- | --- | --- | --- | --- | --- |
| K1  | 0 | 0 | 0 | 0 | 0 | 0 | 1 | 0 | 1 |
| K7  | 1 | 0 | 0 | 0 | 0 | 0 | 0 | 0 | 7 |

Thus each of the output leads S'0; S'1, S2 . . ., S7 of SDEC1 is activated for a corresponding one of the segments K0, K1, K2, . . . K7 and to these segments the decimal values K'=0, 1, 2, . . . , 7 are allocated. However according to the above algorithm this is not correct for segment K0 in the A-law since the value of K' has then to be equal to 1 instead of to 0.

Under the control of a first timing pulse TP3 the bit b1 and the output code S'0, S'1, S2, . . . S7 of SDEC1 is latched in LC3 so that the bit b1 and S2 to S7 are applied to latching circuit LC4, whereas the bits S'0 and S'1 are supplied to the logic circuit LOG1 which is used to calculate the above values a and b of the algorithm in function of the law used (indicated by A) and also to calculate the correct value of K' for segment K0 in the A-law. At its outputs a, b, S0 and S1 the circuit LOG1 provides the like named signals $$a = \overline{S'0} + A$$

$$b = \overline{S'0}(S'1+A)$$

$$S0 = S'0 \cdot A$$

$$S1 = S'0 \cdot \overline{A} + S'1$$

and from these relations it follows that, as required by the above algorithm:
- a=b=1 for the segments K2 to K7 in both the A and mu laws characterized by A=0 and A=1 respectively;
- a=1 and b=0 for segment K0 (mu-law) and K1 (A-law);
- a=b=0 for segment K0 (A-law)

so that the above given segment codes are now changed and give the following altered segment codes:

|     | S7 | S6 | S5 | S4 | S3 | S2 | S1 | S0 |
| --- | --- | --- | --- | --- | --- | --- | --- | --- |
| K0 (mu) | 0 | 0 | 0 | 0 | 0 | 0 | 0 | 1 |
| K0 (A) and K1 | 0 | 0 | 0 | 0 | 0 | 0 | 1 | 0 |
| K7  | 1 | 0 | 0 | 0 | 0 | 0 | 0 | 0 |

Thus the decimal value K'=1 is now allocated to K0 in the A-law, as required.

During the above described operations the second set of bits b5 b6 b7 b8 defining the step code L has been entered in SIPO1. These bits are latched in LC1 under the control of the second timing pulse TP2 shown and afterwards latched in LC2 by timing pulse TP4. As a consequence these bits b5 to b8 are applied to the data inputs 3 of the respective cells PC2 to PC5 of PISO.

By a subsequent timing pulse TP5 the bits b1, S0, S1, S2 to S7 as well as a, b at the outputs of LC3 and LOG1 are latched in latching circuit LC4 as a result of which bit b1 is supplied to OC1, the S-bits are applied to gating circuit GC, and the bits a and b are supplied to the data inputs 3 of the cells PC1 and PC6 of PISO respectively. The altered step code constituted to the bits a, b5, b6, b7, b8, b is now entered in PISO under the control of a second timing pulse TP3 and inverted therein and transferred to the outputs of the cells PC1 to PC6 because timing pulse TP7 is then deactivated. Hence $\overline{a}$, $\overline{b5}$, $\overline{b6}$, $\overline{b7}$, $\overline{b8}$ and $\overline{b}$ are then present at the outputs of these cells.

In this way the altered stepcode, $$L + a \cdot 2^4 + b \cdot 2^{-1}$$

with the bits inverted, is stored in the cells PC1 to PC6 to which the values $2^4$ to $2^{-1}$ are allocated respectively. As follows from the algorithm this value should now be multiplied by $2^{K'}$ to obtain the above value J'. This is described hereinafter.

By the above mentioned negatively directed timing pulse TR6 also the bits S0, S1 and S2 to S7 are applied to the control inputs 5 of the respective cells PC11 to PC18 of SR and because only a single one of these bits is on 1 the switches S1 and S2 are only closed and opened respectively in the cell to which this bit is applied and opened and closed in all other cells respectively. Thus a connection is established between the output 2 of PISO and the output 2 of PC11 of SR via a number of cells equal to the value of K'. For instance, for the segments S0 and S7 the switches S1 and S2 are closed and open in the cells PC11 and PC18 associated to these segments.

Under the control of six timing pulses TP7, applied to the control input 4 of PISO, and of the timing pulses TP1 supplied to the control input 4 of SR the above bits $\overline{b}$, $\overline{b8}$, $\overline{b7}$, $\overline{b6}$, $\overline{b5}$ and $\overline{a}$ are shifted through the series connected cells of PISO and SR, an inversion taking place in the first used cell of SR. In this way the value stored in PISO is inverted and multiplied by a factor equal to $2^{K'}$, so that the above binary value J' is obtained at the output of SR.

According to the above algorithm either a value c=0 for the A-law or a value c=−16 for the mu-law has to be added to this value J' to obtain the wanted value J. This is done in the adder circuit ADD1 which is controlled by the same control input A as LOG1. The result J and the sign bit S are then combined in the output circuit OC1 and possibly transformed before being supplied to output terminal OUT1.

Figure 3:
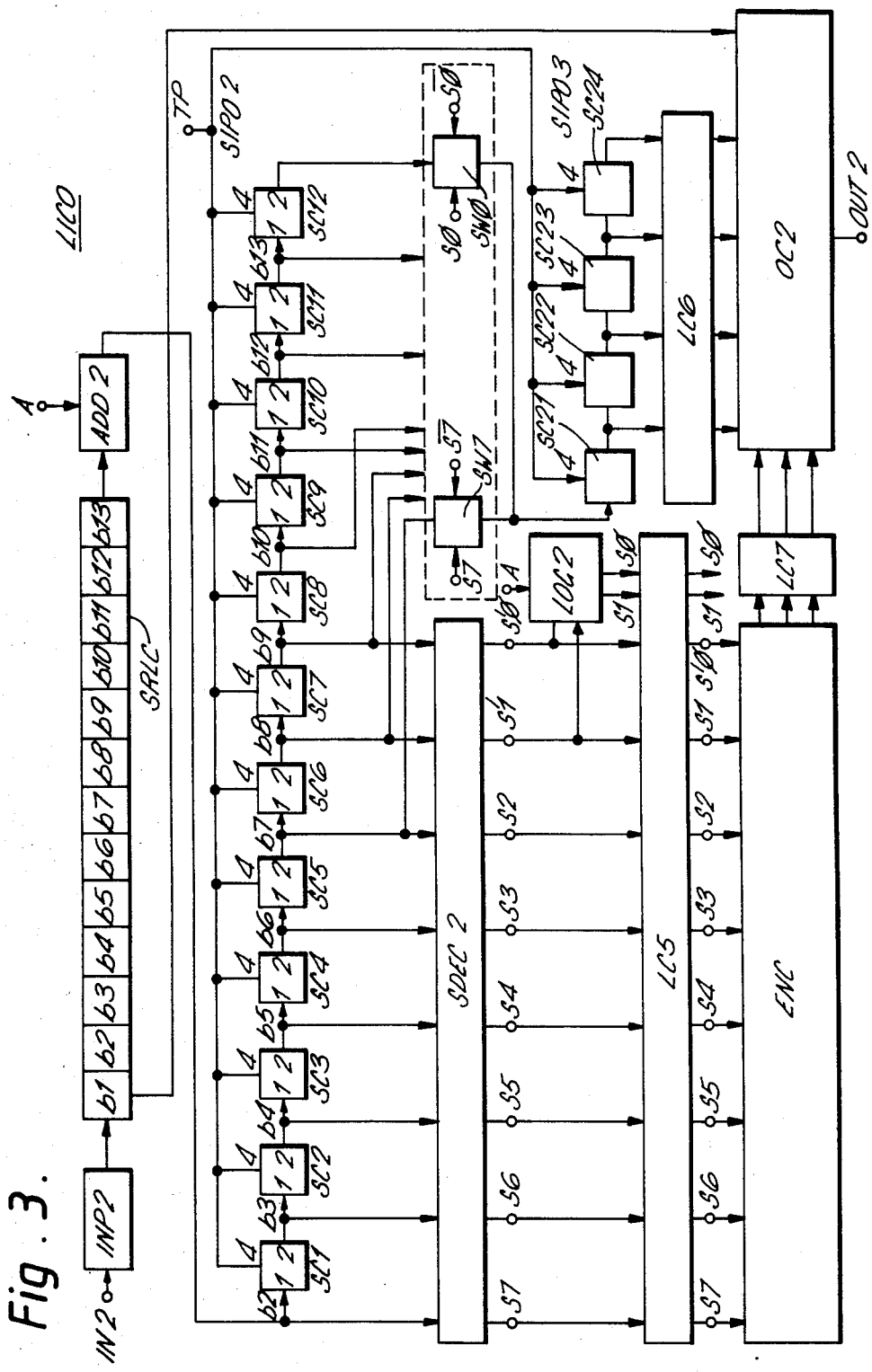

Reference is now made to FIG. 3 showing the LICO circuit, of the transcoder TC, which is adapted to transcoder TC, which is adapted to transcode a 13-bit linear PCM word into an 8-bit companded PCM word. As the COLI circuit, the LICO circuit is controlled by a timing circuit which is now however not shown as it is obvious from the description of the operation of the LICO circuit which will be given later.

The LICO circuit includes an input circuit INP2, a 13-cell shift register and latching circuit SRLC, two serial-in-parallel-out registers SIPO2 and SIP3, a segment decoder circuit SDEC2, and encoder circuit ENC, an adder circuit ADD2, a logic circuit LOG2, latching circuits LC5 to LC7, output circuit OC2 and switches SW0 to SW7. The cells of SIPO2 and SIPO3 are of the type shown in FIG. 4, however to be considered without S1 and S2. Their control inputs 4 are commoned and controlled by timing pulses TP (not shown). The switches SW0 to SW7 are similar to those used in the COLI circuit and as shown in FIG. 4.

The input IN2 of the LICO circuit is connected via the input circuit INP2 to that of SRLC which includes 13 cells and has an output coupled via adder circuit ADD2 to the input 1 of SIPO2. An output of the first cell of SRLC is connected to output circuit OC2, and the adder circuit ADD2 is controlled by control input A which is the same as the one and in the COLI circuit and is therefore on 0 for the A-law and on 1 for the mu-law. The SIPO2 comprises 12 interconnected cells SC1 to SC12 having outputs which are connected to the inputs of the segment decoder SDEC2 which has outputs S'∅, S'1, S2, ..., coupled via latching circuit LC5 to the encoder ENC. The outputs S'∅ and S'1 of SDEC2 are also coupled to the inputs of the logic circuit LOG2 which is also provided with control input A and having outputs S∅ and S1 which are connected to LC5. These outputs S∅ to S7 of LC5 and also their inverse $\overline{S\emptyset}$ to $\overline{S7}$ are connected to the control inputs of the switches SW∅ to SW7 respectively. The data inputs of these switches are connected to the outputs of the respective cells SC5 to SC12 of PISO2 and their data outputs are commoned and connected to the input of SIPO3. The outputs of SIPO3 and those of the encoder circuit ENC are connected via the respective latch circuits LC6 and LC7 to the output circuit OC2 whose output OUT2 constitutes the output of the LICO.

It may be shown that a suitable algorithm for transcoding a 13-bit linear PCM word comprising bits b1 to b13, with sign bit S=b1 and magnitude J defined by the bits b2 to b13, into a 8-bit companded PCM word with sign bit S, segment K and step L, is given by:

$$K = \log_2 [(J+c) \cdot 2^{-4}]$$

and $$L = (J+c) \cdot 2^{-K} - d$$

wherein
c=0 for the A-law;
c=16 for the mu-law;
and with K' equal to ∅ to 7 and d=16 for the segments K∅ to K7, except for segment K∅ in the A-law for which this value is 1 instead of ∅ for which also d=0. To be noted that for K a lower limit is calculated.

The LICO circuit described above is able to calculate this algorithm in the way described hereinafter.

A linear PCM input word applied to the input INP2 of the LICO with the least significant bit (LSB) first is possibly transformed in input circuit INP2 and the resulting 13-bit linear PCM word comprising bits b1 to b13 (FIG. 1) with sign bit S=b1 and magnitude J=b2 . . . b13 is stored in register SRLC. The sign bit S=b1 is applied to output circuit OC2 and the bits b2 to b13, defining the magnitude J, are serially entered into SIPO2 by the timing pulses TP and via the adder circuit ADD2 where c=0 or c=16 is added to the value J depending on a conversion in the A-law or mu-law being required (as indicated by control input A). Hence the word stored into SIPO2 is the altered input word J+c. As bit b13 is the least significant bit and has the weights 2° the eight bits b2 to b9 define the value $(J+c) \cdot 2^{-4}$ which will now be used to determine $$K = \log_2 (J+c) \cdot 2^{-4}$$

This is done by determining only the highest power of 2 of $(J+c) \cdot 2^{-4}$. This highest power defines the lower limit of the segment, as will be explained later.

With this purpose the inputs b2 to b9 of the cells SC1 to SC8 of SIPO2 are connected to an obvious segment decoder SDEC2 which transforms the following 8-bit binary input codes,

| b2 | b3 | b4 | b5 | b6 | b7 | b8 | b9 |
|----|----|----|----|----|----|----|----|
| 1  | X  | X  | X  | X  | X  | X  | X  |
| ∅  | 1  | X  | X  | X  | X  | X  | X  |
| ∅  | ∅  | 1  | X  | X  | X  | X  | X  |
| ∅  | ∅  | ∅  | 1  | X  | X  | X  | X  |
| ∅  | ∅  | ∅  | ∅  | 1  | X  | X  | X  |
| ∅  | ∅  | ∅  | ∅  | ∅  | 1  | X  | X  |
| ∅  | ∅  | ∅  | ∅  | ∅  | ∅  | 1  | X  |
| ∅  | ∅  | ∅  | ∅  | ∅  | ∅  | ∅  | X  | wherein X has an arbitrary value, into the following corresponding 1-out-of-8 segment codes provided at the like named outputs of SDEC2

|    | S7 | S6 | S5 | S4 | S3 | S2 | S'1 | S'∅ | Decimal value K' |
|----|----|----|----|----|----|----|-----|-----|------------------|
| K7 | 1  | ∅  | ∅  | ∅  | ∅  | ∅  | ∅   | ∅   | 7 |
| K6 | ∅  | 1  | ∅  | ∅  | ∅  | ∅  | ∅   | ∅   | 6 |
| K5 | ∅  | ∅  | 1  | ∅  | ∅  | ∅  | ∅   | ∅   | 5 |
| K4 | ∅  | ∅  | ∅  | 1  | ∅  | ∅  | ∅   | ∅   | 4 |
| K3 | ∅  | ∅  | ∅  | ∅  | 1  | ∅  | ∅   | ∅   | 3 |
| K2 | ∅  | ∅  | ∅  | ∅  | ∅  | 1  | ∅   | ∅   | 2 |
| K1 | ∅  | ∅  | ∅  | ∅  | ∅  | ∅  | 1   | ∅   | 1 |
| K∅ | ∅  | ∅  | ∅  | ∅  | ∅  | ∅  | ∅   | 1   | ∅ |

SDEC2 for instance includes a plurality of clocked AND-gates defining the Boolean function b2; $\overline{b2}$.b3; $\overline{b2}$ $\overline{b3}$.b4; ...; $\overline{b2}$ $\overline{b3}$ $\overline{b4}$ $\overline{b5}$ $\overline{b6}$ $\overline{b7}$ $\overline{b8}$. The output of each of these gates is connected to a corresponding single one of the output leads S7 ... S'∅ directly and via inverter to the other ones.

The latter output leads S'∅, S'1 ..., S7 of SDEC2 are associated to respective segments K∅, K1, ..., K7 to which the indicated decimal values K' are allocated.

From the above first table it follows that SDEC2 in fact detects the first 1 in the series of bits b2 to b9, except for K∅, and ignores the following binary values in this series. This means that it detects the highest power of 2 and does not take the lower powers of 2 into account. Thus each of the segments K∅ to K7 is defined by its lower limit. K∅ is detected if all bits b2 to b8 are ∅ and independently of bit b9, since one is then sure that segment ∅ is concerned.

The above outputs S'∅, S'1, ... S7 are applied to latch circuit LC5 and from there they are supplied to the encoder circuit ENC which translates the 1-out-of-8 segment codes according to the last given table into 3-bit segment codes which are supplied via latch circuit LC7 to output circuit OC2.

During the above described operations the value J+c has been shifted in SIPO2 one step to the right so that bits b2 to b13 are now present at the outputs of the respective cells SC1 to SC12 thereof.

The above step value $$L = (J+c) \cdot 2^{-K} - d$$

is now determined. To this end the above decimal value of K' can be used for the segments K∅ (mu-law) and K2 to K7 (both laws), but not for segment K∅ (A-law) because in this case the step size is equal to that for segment K1. To take this into account the output signals S'∅ and S'1 of SDEC2 are supplied to the logic circuit LOG2 which provides at its outputs S∅ and S1 the signals $$S\emptyset = S'\emptyset \cdot A$$

and $$S1 = S'\emptyset \cdot \overline{A} + S'1$$

The output signals $\overline{S\emptyset}$ to $\overline{S7}$, together with $\overline{S\emptyset}$ to $\overline{S7}$, are applied to the control inputs of the switches $SW\emptyset$ to $SW7$ respectively. As a consequence and depending on the decimal value of $K'$ being $\emptyset, 1, \ldots, 7$ the output of SC12, SC11, ..., SC5 respectively is coupled to the input of SIPO3. By shifting out the contents of the cells at the left hand of the last mentioned cells one would obtain the value $$(J+c) \cdot 2^{-K'}$$

However, one only shifts out four bits into the four cells of SIPO2, so that the following binary values are stored therein

| | | | | |
|---|---|---|---|---|
| for K∅ (mu-law) | b10 | b11 | b12 | b13 |
| for K∅ (A-law) and K1 (A, mu-laws) | b9 | b10 | b11 | b12 |
| . | | | | |
| . | | | | |
| for K7 (A, mu-laws) | b3 | b4 | b5 | b6 |

Thus one each time ignores the preceding bits, these bits on $\emptyset$, except the last one which is on 1 for segments K$\emptyset$ (mu-law) and K1 to K7 (both laws) and on $\emptyset$ for segment K$\emptyset$ (A-law). In other words bits b9 (K$\emptyset$, mu-law) and b8 (K1, both laws) to b3 (K7, both laws) are 1, whereas b8=0 (K$\emptyset$, A-law. By not taking these bits into account one thus in fact subtracts $1 \cdot 2^4$ or $0 \cdot 2^4$ from the value stored in SIPO3. Hence this value is really the 4-bit step code $$L = (J+c)2^{-K'} - 16$$

or $$L = (J+c)2^{-K'},$$

as required.

The contents of SIPO3 are latched in LC6 and thus applied to the output circuit OC2. Therein the sign, the 3-bit segment code and the 4-bit step code are serially applied to the output OUT2.

While the principles of the invention have been described above in connection with specific apparatus, it is to be clearly understood that this description is made only by way of example and not as a limitation on the scope of the invention.

We claim:

1. A Pulse Code Modulation (PCM) translator for translating a PCM input word into a PCM output word, one of said words being in accordance with a compressed code and the other word in accordance with a linear code, wherein the binary bits of the input word are converted into those of the output word in accordance with either the A-law or the mu-law as determined by the selectable binary value of a control bit (A) which determines the digital values of several coding parameters (a, b, c, K'; c, d, K') of the translator; including means for translating a compressed PCM input word portion including a 3-bit segment code portion and a 4-bit step code into a linear PCM output word by determining the function $$J = (L + a \cdot 2^4 + b \cdot 2^{-1}) \cdot 2^{K'} + c$$

wherein

J is said output word;
L is said step code;
a, b and c are variables;
K' is related to said segment code and is dependent, together with said variables a, b and c, on said control bit (A) indicating that said input word is coded according to the A-law or mu-law;

decoder means for decoding said 3-bit segment code into a 1-out-of-8 code S7, S6, ..., S'1, S'0;

logic means coupled to said decoder means and controlled by said control bit (A) and providing the variables:

$$a = S'O + A$$

$$b = S'O(S'1 + A)$$

$$SO = S'O \cdot A$$

$$S1 = S'O \cdot A + S'1$$

the code word S7, ... S1, S0 constituting an altered segment code having a decimal value K';

means (SIPO) for modifying said step code L by said variables a and b so as to obtain an altered step code $$L + a \cdot 2^4 + b \cdot 2^{-1}$$

multiplier means coupled to said modifier means for multiplying said altered step code with $2^{K'}$ so as to obtain the product $$(L + a \cdot 2^4 + b \cdot 2^{-1}) \cdot 2^{K'}$$

and adder means coupled with said mulitplier means and controlled by said control bit (A) to add said variable c to said product so as to obtain said output word J.

2. A PCM translator according to claim 1, wherein said modifier means include a 6-stage first shift register for storing the variable a, the step-code L and the variable b, and that said multiplier means include an 8-stage second shift register, the output of said first shift register being coupled to inputs of said stage of said second shift register through respective first gating means controlled by respective bits S7, ... S1, S0 of said bits of the altered segment code which also control respective second gating means which are each associated to one of said stages and are each always in an opposite state of conductivity than the first gating means associated to this stage, all in such a manner that when said output of said first register is coupled to that of said second register through a first gating means and a number of stages equal to said decimal value K', these stages are isolated from the other ones by a second gating means.

3. A PCM translator according to claim 1, for translating a linear PCM input word into a compressed PCM output word including a 3-bit segment code and a 4-bit step code by determining the functions $$K = \text{Log}_2 [(J+c) \cdot 2^{-4}]$$

$$L = (J+c) \cdot 2^{-K'} - d$$

wherein

J is said input word;

K is said segment code;
L is said step code;
c and d are variables
K' is related to said segment code and is dependent together with c and d on said control bit (A) indicating that said output word is coded according to the A- or mu-law; adder means controlled by said control bit (A) to add said variable c to said input word J to obtain an altered input word J+c and store it in a shift register;
decoder means coupled with said shift register for decoding and 8 most significant bits of said altered input word J+c into a 1-out-of-8 code S7, S6, . . . , S'1, S'0, but by taking only the activated bit of highest power of said altered input word into account;
encoder means coupled to said decoder means for coding said 1-out-of-8 code into said 3-bit segment code K;
logic means which are coupled to said decoder means and controlled by said control bit (A) and which provides the variables:

$$S0 = S'0 \cdot A$$

$$S1 = S'0 \cdot A + S'1$$

the code word S7, . . . S1, S0 having the decimal value K';
multiplier and adding means for multiplying said altered input word J+c by $2^{-k'}$ and adding said variable -d to this product so as to obtain said step code L.

4. A PCM translator according to claim 3, wherein said multiplier and adder means include a 4-stage second shift register, whose input is connected to the K' least significant stages of said first shift register (SIPO2) through respective first gating means (SW7–SW0) controlled by respective ones of said code bits S7 to S0 with decimal value K', all in such a manner that the input of said first shift register is coupled to that of said second shift register through a corresponding number of stages, and means to shift the contents of four of said most significant stages of said first register into the four stages of said second register so as to obtain said step code L.

* * * * *